United States Patent
Nakamura

(10) Patent No.: US 10,681,822 B2
(45) Date of Patent: Jun. 9, 2020

(54) METHOD FOR CORRECTING SOLDER BUMP

(71) Applicant: SENJU METAL INDUSTRY CO., LTD., Tokyo (JP)

(72) Inventor: Hideki Nakamura, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 16/062,853

(22) PCT Filed: Dec. 15, 2016

(86) PCT No.: PCT/JP2016/087372
§ 371 (c)(1),
(2) Date: Jun. 15, 2018

(87) PCT Pub. No.: WO2017/104746
PCT Pub. Date: Jun. 22, 2017

(65) Prior Publication Data
US 2019/0132960 A1    May 2, 2019

(30) Foreign Application Priority Data

Dec. 15, 2015  (JP) ................... 2015-244142

(51) Int. Cl.
*B23K 3/00*     (2006.01)
*H05K 3/34*     (2006.01)
(Continued)

(52) U.S. Cl.
CPC ......... *H05K 3/3468* (2013.01); *B23K 3/0623* (2013.01); *B23K 3/0638* (2013.01);
(Continued)

(58) Field of Classification Search
CPC ............................ B23K 26/384; B23K 26/389
See application file for complete search history.

(56) References Cited

U.S. PATENT DOCUMENTS

| | | | |
|---|---|---|---|
| 4,898,117 A | 2/1990 | Ledermann et al. | |
| 4,934,309 A | 6/1990 | Ledermann et al. | |
| 2015/0007958 A1 | 1/2015 | Sato et al. | |

FOREIGN PATENT DOCUMENTS

| | | | |
|---|---|---|---|
| EP | 2770528 A1 | 8/2014 | |
| JP | H02-015698 A | 1/1990 | |

(Continued)

OTHER PUBLICATIONS

International Search Report (in English and Japanese) issued in PCT/JP2016/087372, dated Feb. 28, 2017, ISA/JPO.

(Continued)

*Primary Examiner* — Erin B Saad
(74) *Attorney, Agent, or Firm* — Harness, Dickey & Pierce, P.L.C.

(57) ABSTRACT

A pattern formed on a silicon wafer is fine so that solder bumps formed on the silicon wafer are also fine and hence, when a failure occurs, the failure cannot be corrected so that an entire silicon wafer as a workpiece is discarded. Provided is a correction method where, on solder bumps formed on the silicon wafer, a mask in which holes are formed with the same pattern as the solder bumps is placed so as to cover the solder bumps and, thereafter, molten solder is caused to come into contact with the solder bumps through the mask thus filling hole portions of the mask with the molten solder.

4 Claims, 6 Drawing Sheets

(51) Int. Cl.
*H01L 23/00* (2006.01)
*B23K 3/06* (2006.01)
*H05K 3/00* (2006.01)

(52) U.S. Cl.
CPC ............ *H01L 24/11* (2013.01); *H01L 24/741* (2013.01); *H01L 24/742* (2013.01); *H05K 3/0094* (2013.01); *H05K 3/34* (2013.01); *H01L 24/13* (2013.01); *H01L 24/94* (2013.01); *H01L 2224/113* (2013.01); *H01L 2224/11312* (2013.01); *H01L 2224/131* (2013.01); *H01L 2224/94* (2013.01); *H05K 2201/10151* (2013.01)

(56) References Cited

FOREIGN PATENT DOCUMENTS

| | | | |
|---|---|---|---|
| JP | 11040937 A | * | 2/1999 |
| JP | H11-274706 A | | 10/1999 |
| JP | 2003-182025 A | | 7/2003 |
| JP | 2014-157863 A | | 8/2014 |
| WO | WO-2013058299 A1 | | 4/2013 |

OTHER PUBLICATIONS

Extended European Search Report dated Sep. 30, 2019 in corresponding EP Patent Application No. 16875723.5.

* cited by examiner

METHOD FOR CORRECTING SOLDER BUMP

CROSS REFERENCE TO RELATED APPLICATIONS

This application is a U.S. National Phase Application under 35 U.S.C. 371 of International Application No. PCT/JP2016/087372 filed on Dec. 15, 2016 and published in Japanese as WO 2017/104746 A1 on Jun. 22, 2017, which is based on and claims the benefit of priority from Japanese Patent Application No. 2015-244142 filed on Dec. 15, 2015. The entire disclosures of all of the above applications are incorporated herein by reference.

TECHNICAL FIELD

The present invention relates to a correction method where solder is additionally supplied to a portion having chipping and/or an insufficient amount of solder in solder bumps formed on a board or an electronic component workpiece such as a semiconductor.

BACKGROUND ART

To mount an electronic component, such as a semiconductor, on a printed circuit board of electronic equipment or to assemble an electronic component, such as a semiconductor, solder or an adhesive agent is used. Particularly, soldering cannot be performed on an electronic component made of ceramic or the like without performing any treatment. In view of the above, pads formed of a plating film are formed on a surface of an electronic component workpiece, and solder bumps (bulges) are formed on the pads. Thereafter, soldering is performed using the bumps.

Conventionally, a method which uses a solder paste is used as a method for forming solder bumps in many cases. A solder paste is applied on a plating film of a workpiece by a printer or a dispenser and, thereafter, the solder paste is subjected to reflow heating so as to melt the solder paste to form bumps. This method enables low cost. However, on printing, there is a lower limit on the separation at which printing can be performed and hence, bumps which correspond to a fine circuit pattern cannot be formed.

There is also a method for forming a bump by making use of a solder ball. Fine solder balls are mounted on an electronic component workpiece, and the solder balls are subjected to reflow heating thus forming bumps. With the use of such a method, bumps which correspond to a fine circuit pattern can be formed. However, cost for solder balls per se is high so that cost increases as a whole.

As a method for forming bumps which can manage a fine circuit pattern at low cost, a so-called molten solder method has been attracting attention where molten solder is discharged so as to form solder bumps. For example, a solder deposition device disclosed in PTL 1 described below is known as a device for realizing the molten solder method. In this solder deposition device, a nozzle opening portion of a vessel which stores molten solder is caused to scan in the horizontal direction thus efficiently supplying molten solder to a plurality of portions. A bump forming device is also known which includes a mechanism for lifting a nozzle head from a mask after the operation is finished and the nozzle head is cooled (for example, PTL 2 described below).

CITATION LIST

Patent Literature

PTL 1: Japanese Patent Laid-Open No. H2-015698
PTL 2: WO2013/058299A

SUMMARY OF INVENTION

Technical Problem

In forming solder bumps on a workpiece such as a silicon wafer, in general, the solder bumps are collectively formed on the entire workpiece or a portion of the workpiece in all methods which use a solder paste, solder balls, or molten solder. However, when some of the solder bumps, which are collectively formed, have a defect and/or an insufficient amount of solder, a problem occurs in a solder bonding portion which is formed of the solder bumps. A pattern formed on a silicon wafer is fine so that solder bumps formed on the silicon wafer are also fine. Accordingly, when a problem occurs, the problem cannot be corrected so that an entire silicon wafer forming a workpiece is discarded. The present invention provides a method for correcting a solder bump when some of solder bumps formed on a silicon wafer have a defect and/or an insufficient amount of solder.

Solution to Problem

Inventors of the present invention have found the following. That is, when some of bumps have a defect and/or an insufficient amount of solder, a mask with the same pattern as the solder bumps is placed on the solder bumps so as to cover the solder bumps, and molten solder is caused to come into contact with the defective bumps through the mask. With such operations, a portion having a defect and/or an insufficient amount of solder is filled with the molten solder so that the solder bumps can be corrected.

According to one embodiment of the present invention, a correction method for correcting a solder bump formed on a workpiece is provided. In this method, on the solder bumps formed on a silicon wafer, a mask in which holes are formed with the same pattern as the solder bumps is placed so as to cover the solder bumps. Thereafter, molten solder is caused to come into contact with the solder bumps through the mask so as to fill hole portions of the mask with the molten solder thus correcting the solder bumps formed on the silicon wafer. In the case where some of the bumps have a defect and/or an insufficient amount of solder, by additionally supplying a solder to the above-mentioned some solder bumps, complete solder bumps can be acquired.

According to this embodiment, by changing a thickness of the mask formed on the silicon wafer on which correction is to be performed, it is possible to control an amount of solder to be filled. This method can be also used for causing solder bumps which are manufactured by a method for forming a solder bump where a height control is difficult such as a method for forming a solder bump using a solder ball, to have a uniform height thus correcting heights of the bumps. The mask used in this embodiment may be any mask in which hole portions are formed in the mask with the same pattern as the solder bumps and the mask has a constant thickness. A heat-resistant resin film made of polyimide or the like may be used. Alternatively, a mask which is directly formed on a silicon wafer using a resist may be also used for the purpose of correction.

With the use of a method for correcting a solder bump of this embodiment, when some of bumps have a defect and/or an insufficient amount of solder, correction can be performed on a silicon wafer having the defective solder bumps. Accordingly, a silicon wafer which has been discarded conventionally can be used again thus realizing a large reduction in a material cost and a reduction in the number of steps. In this method, the mask determines a height of solder bumps. Accordingly, this method can be also used for causing solder bumps which are manufactured by a method for forming a solder bump where a height control is difficult such as a method for forming a solder bump using a solder ball, to have a uniform height thus correcting heights of bumps. Accordingly, a conventional step where a preform or the like is additionally supplied to solder can be replaced with a step of this method.

DESCRIPTION OF EMBODIMENT

Figure 1:
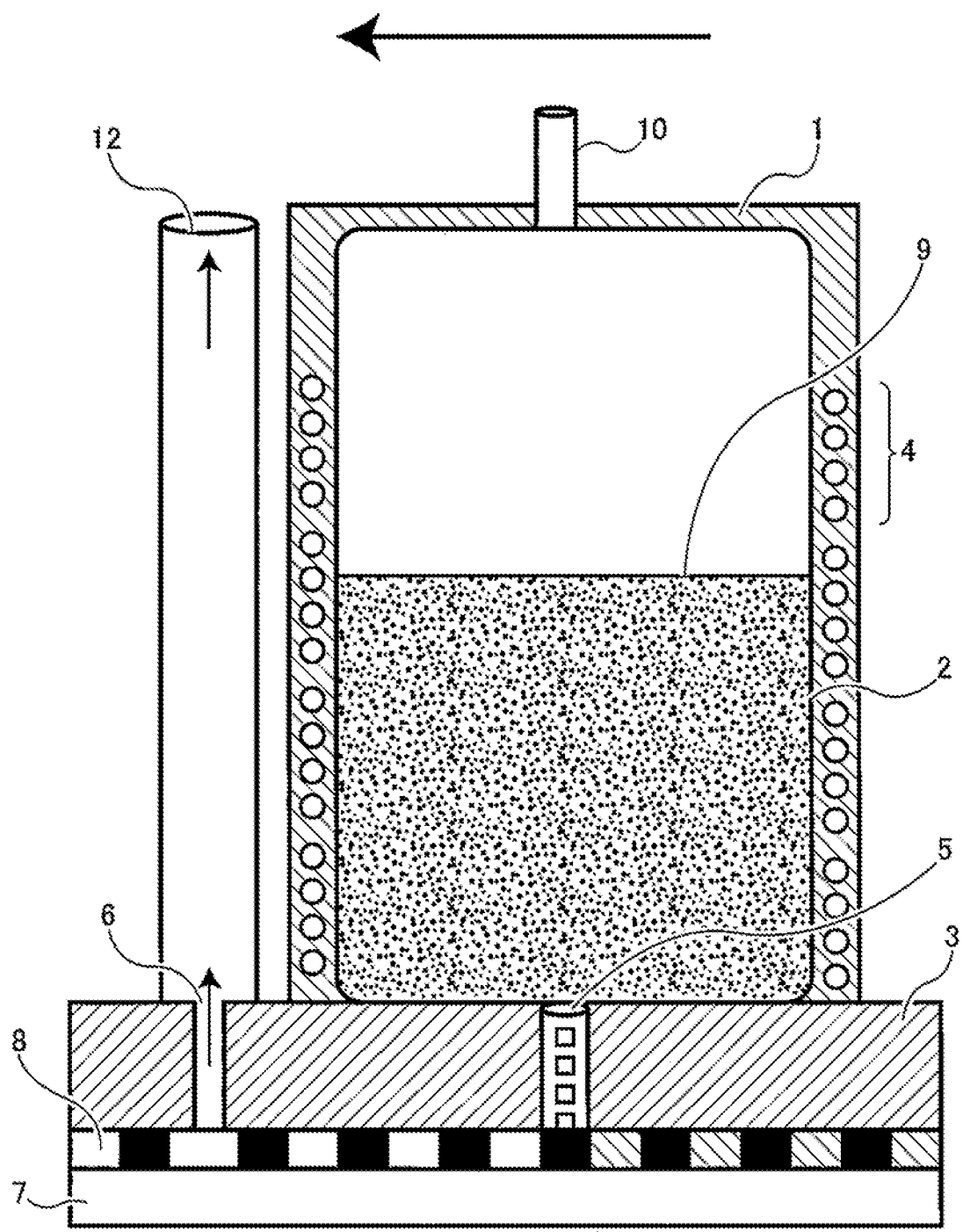
FIG. 1 is a schematic view showing one example of a solder bump correction device used in one embodiment of the present invention.
Figure 2:
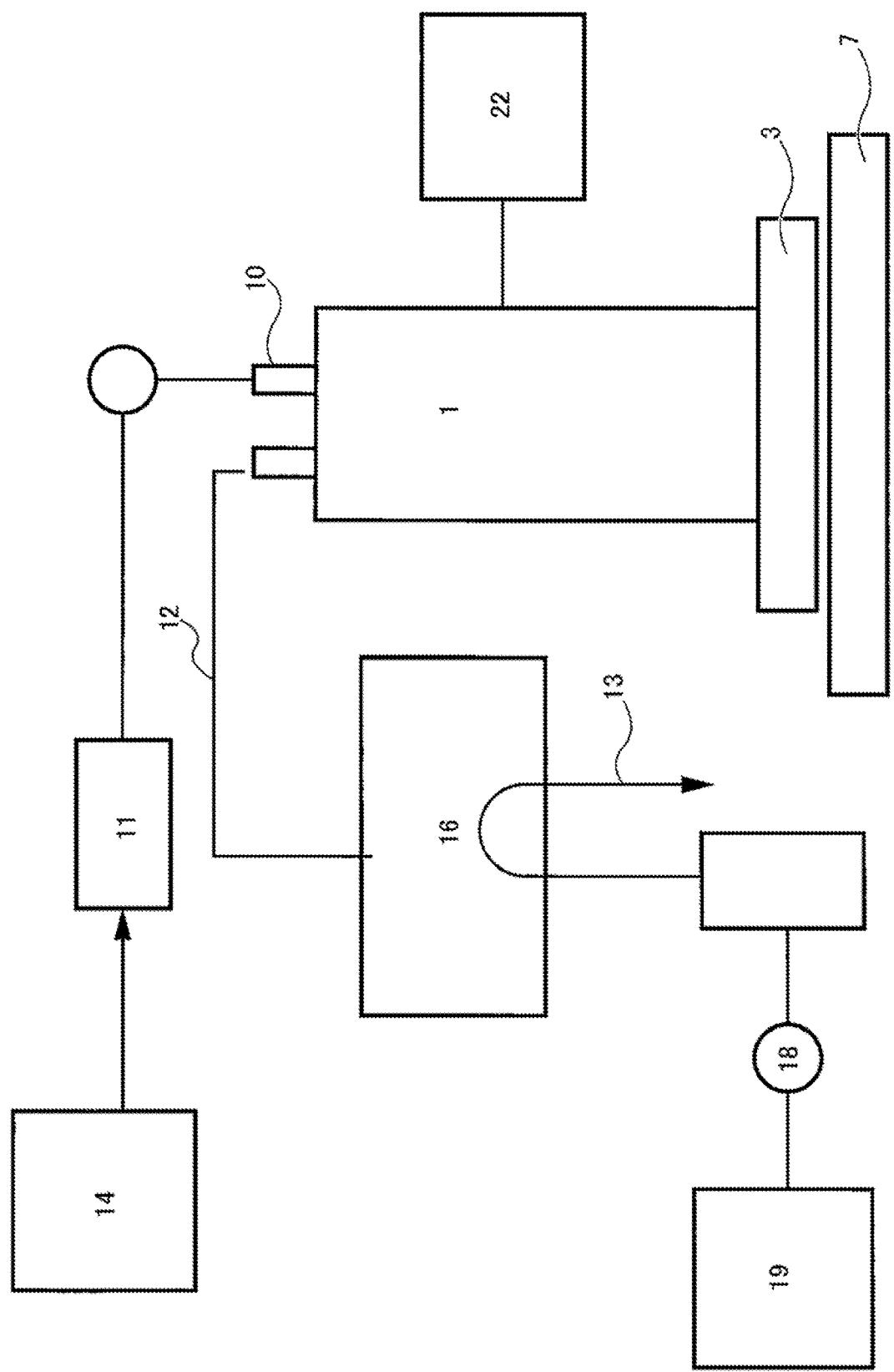
FIG. 2 is a schematic view showing a schematic configuration of the correction device according to one embodiment of the present invention.

A configuration of a correction device according to one embodiment of the present invention is described. FIG. 1 is a view showing a head unit 1 of the correction device according to one embodiment of the present invention. FIG. 2 is a schematic view showing a schematic configuration of the correction device according to one embodiment of the present invention. The head unit 1 includes: a tank 2 which can store molten solder or the like; and a correction head 3 which is provided on a lower end of the head unit 1. When a fluid which requires a temperature control, such as molten solder, is used, a heating means may be mounted on the fluid tank 2. For example, a heater 4 may be wound around a middle portion of the fluid tank 2. The correction head 3 has a correction nozzle 5 and a suction port 6 which are provided at a lower end of the head. The suction port 6 is formed in the correction head 3 such that a suction step can be performed prior to a step performed by the correction nozzle 5 in the traveling direction. When a fluid which requires a temperature control is used also in the correction nozzle 5 and the suction port 6, a heater 4 may also be mounted on a lower end of the correction head 3.

A circular shape, a slit shape or any other known shape may be adopted as the shape of a nozzle opening of the correction head 3. Particularly, with the use of a slit shape as the shape of the nozzle opening, a fluid can be discharged to a plurality of discharge targets on a workpiece 7 simultaneously. A circular shape, a slit shape or any other known shape may be adopted also as the shape of the suction port 6 formed in the correction head 3. However, with the use of a slit shape as the shape of the opening, air in a mask 8 can be simultaneously removed with respect to a plurality of portions on the workpiece 7 such as a silicon wafer or a printed circuit board.

Next, the overall configuration is described. Although not shown in the drawing, the correction device is movable in the upward and downward direction (Y) such that the correction device approaches and separates from the electronic component workpiece 7 on which correction is required to be performed. The correction device is movable also in the horizontal direction (X). The mask 8 which is made of polyimide or a resist is placed on an upper portion of the workpiece 7 when necessary. On performing correction, the correction head 3 descends to a position where the correction discharge nozzle 5 comes into contact with the workpiece 7. A downward pressure is applied to the correction head 3 from a point of time when the correction discharge nozzle 5 comes into contact with the workpiece 7 until a point of time when the correction discharge nozzle 5 moves away from the workpiece 7.

The liquid correction head 3 moves horizontally while maintaining a contact state between the correction nozzle 5 and the workpiece 7. When the correction head 3 moves horizontally, first, air in the mask 8, which is installed on the workpiece 7, is sucked through the suction port 6 formed such that a suction step can be performed first in the traveling direction. A fluid discharged into the mask 8 at an n-th discharge (excluding a first discharge) can be also sucked at this stage of operation. When a fluid which requires a heating means is used, the fluid is heated by the heater 4 installed at a lower portion of the correction head 3 thus allowing the fluid to be sucked. Thereafter, when the liquid correction head 3 moves horizontally, a fluid is discharged from the opening of the correction nozzle 5 so that the fluid is applied into the mask 8 on the workpiece 7. When the application of the fluid is finished, the liquid correction head 3 is raised so as to separate from the workpiece 7. The same step may be performed also in the case where the mask 8 is not used.

The correction device 1 includes the heater 4 for maintaining a fluid in the tank 2 at a desired temperature. The heater 4 may be incorporated in a wall portion of the tank 2. The heater 4 is managed and controlled so as to be heated to an appropriate temperature for maintaining a viscosity of the fluid 9 in the tank 2, such as molten solder, which is optimal for correction conditions.

The fluid discharge device 1 is connected to a pressure supply means 11, which allows fluid communication, through an extension pipeline 10 from the tank 2. The fluid discharge device 1 is connected to a reduced pressure supply means 13, which allows fluid communication, through a suction pipe extension pipeline 12 which continues from the suction port 6. The pressure supply means 11 includes a pressure generating source 14 which generates a nitrogen gas of a pressure of 0.06 to 0.1 MPa (not limited to such a value), for example. The pressure generating source 14 supplies a pressure into the tank 2 through a gate valve 15 and a three-way valve 16. Molten solder held in the tank 2 is injected from the opening of the correction nozzle 5 upon receiving a pressure from the pressure generating source 14.

The reduced pressure supply means 13 includes a micro ejector 16 which is a reduced pressure generating device. The reduced pressure generating device 16 is connected to a pressure generating source 19, which generates a nitrogen gas of a pressure of 0.4 MPa (not limited to such a value), through a regulator 17 and a throttle valve 18, for example. The reduced pressure generating device 16 supplies a negative pressure to the suction port 6 through the suction pipe extension pipeline 12.

The correction device includes a pressure sensor 20 and a controller 21. The pressure sensor 20 is connected to the throttle valve 18 disposed in the extension pipeline 17, which allows fluid communication with the inside of the tank 2, and the pressure sensor 20 monitors a pressure in the tank 2. A signal indicating a pressure in the tank 2 is transmitted to the controller 21 from the pressure sensor 20. The controller 21 operates the pressure generating source 14, the reduced pressure generating device 16, the regulator 17, the pressure generating source 19 and the respective valves according to the progress of the operating steps so as to supply a pressure into the tank 2. An appropriate value of pressure required to be supplied is determined based on a signal from the pressure sensor 20. When molten solder in the tank 2 is injected from the opening of the correction nozzle 5, the operation is performed so as to allow fluid communication between the inside of the tank 2 and the pressure sensor 20. A magnitude of positive pressure to be supplied into the tank 2 can be varied by adjusting, by the controller 21, a value of pressure generated by the pressure generating source 14, for example. Alternatively, a value of pressure may be varied by adjusting a regulating valve (not shown in the drawing) disposed on the pressure supply means 11 using the controller 21.

Figure 3A:
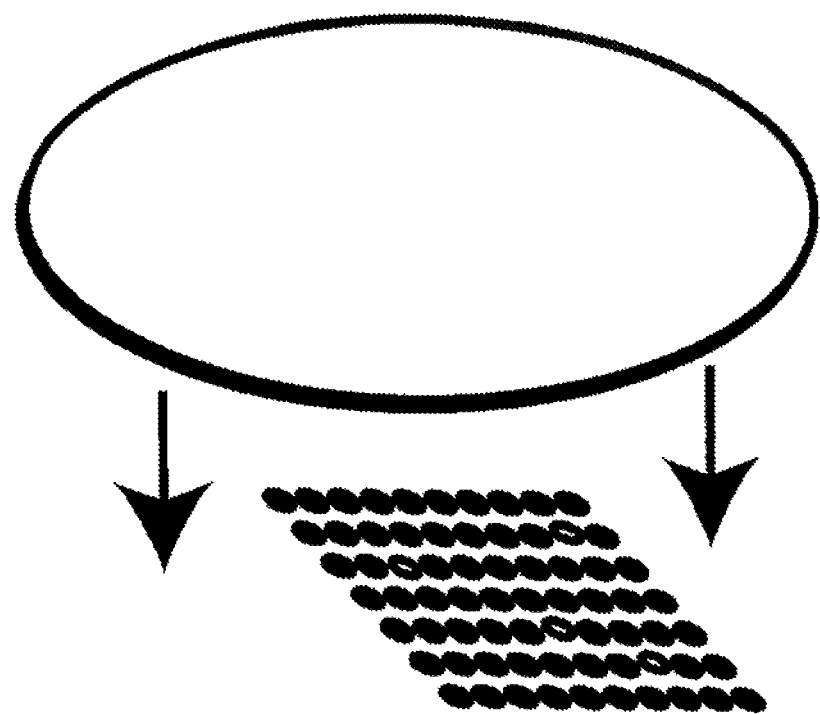
FIG. 3A is a schematic view showing a step of a method for correcting a solder bump according to one embodiment of the present invention.

Next, the manner of operation of the correction device is described. First, as shown in FIG. 3A, a mask is placed so as to cover portions to be corrected of the workpiece 7 as needed. In this embodiment, a seat-like polyimide seat is used. Hole portions are formed in the seat at the same positions as the portions to be corrected. After positions of the portions to be corrected and positions of the hole portions are aligned, the mask, which is placed so as to cover the portions to be corrected, is fixed.

Figure 3B:
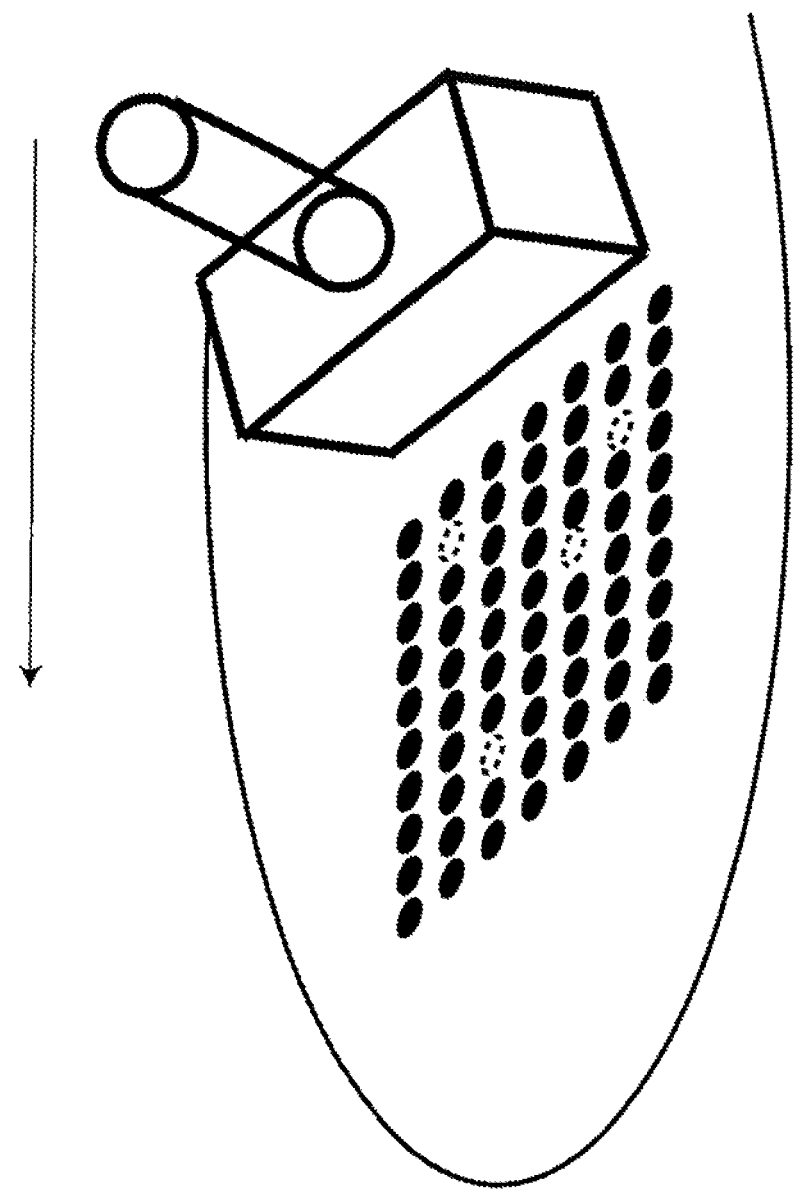
FIG. 3B is a schematic view showing a step of the method for correcting a solder bump according to one embodiment of the present invention.

After the preparation is finished, as shown in FIG. 3B, the correction head 1 of the correction device is mounted on the workpiece, and a correction step starts. The correction head 1 is fixed at a predetermined position separated from the workpiece 7. However, upon discharging a fluid, the correction head 1 moves in the upward and downward direction as well as in the horizontal direction so that the correction head 1 descends to the position where the correction head 1 comes into contact with a discharge portion of the mask 8 on the workpiece 7. A pressure is always applied to the correction head 1 of the correction device so that the correction discharge nozzle 5 is in contact with the workpiece 7 when the correction head 3 descends.

Figure 3C:
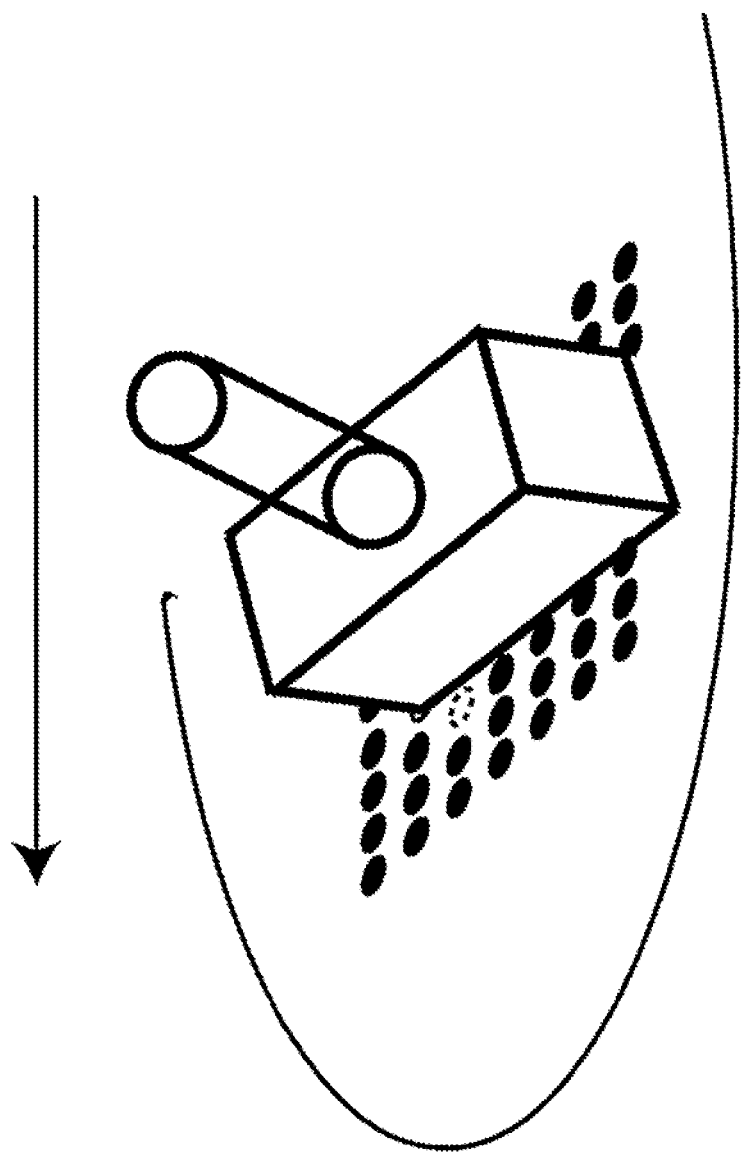
FIG. 3C is a schematic view showing a step of the method for correcting a solder bump according to one embodiment of the present invention.
Figure 3D:
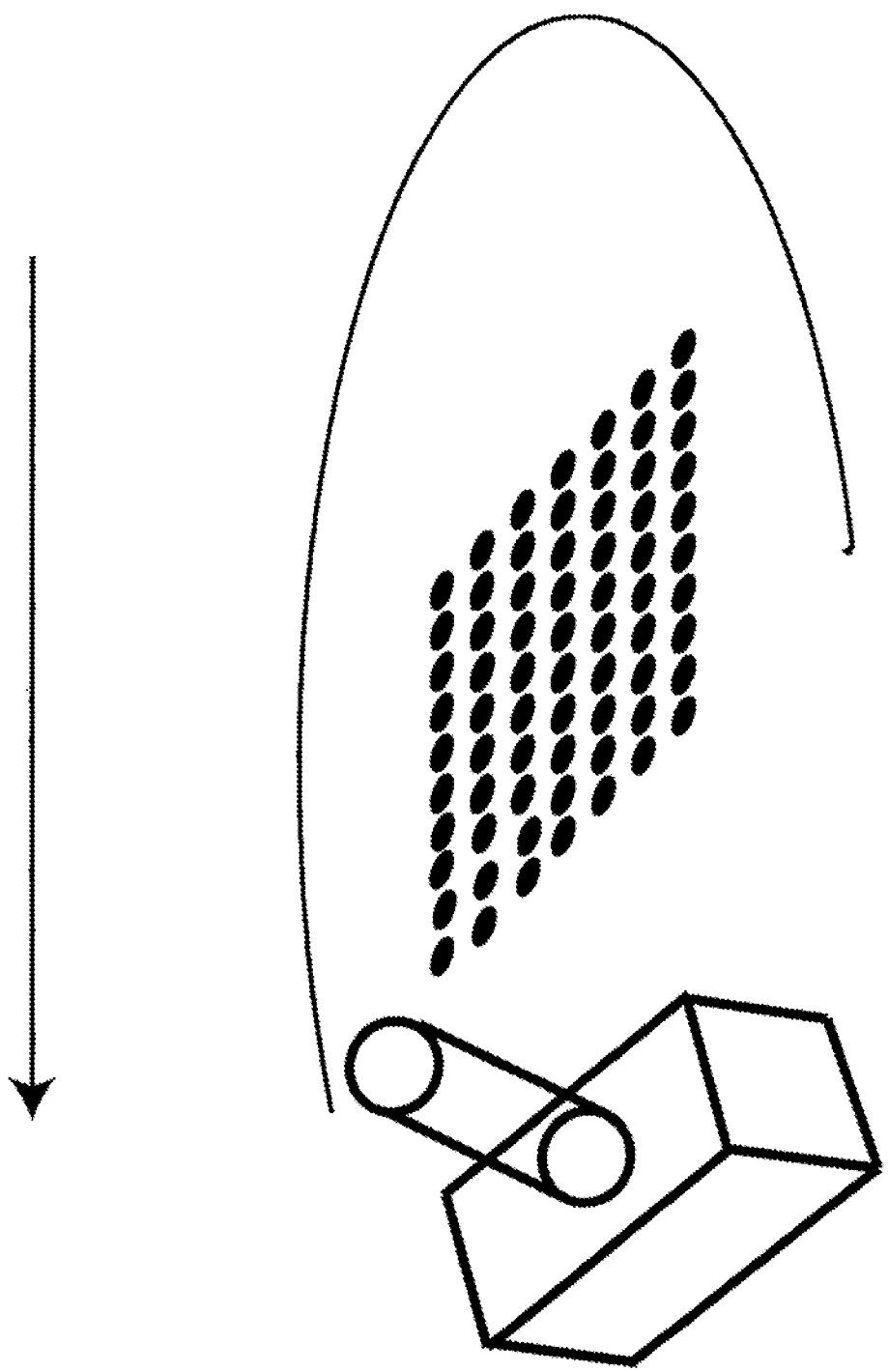
FIG. 3D is a schematic view showing a step of the method for correcting a solder bump according to one embodiment of the present invention.

The correction head 3 moves slidingly on the mask 8 on the workpiece 7 such that the correction head 1 moves horizontally so that the side where the suction nozzle 5 is provided is located forward and reduces a pressure of air in an opening portion of the mask 8 on the workpiece 7 and, thereafter, the mask 8 comes into contact with heated molten solder in the tank 2 through the correction nozzle 5. A pressure supplied from the pressure generating source 14 supplies a positive pressure into the tank 2 through the gate valve 15. The molten solder 9 held in the tank 2 comes into contact with a solder bump of the workpiece at an opening of the discharge nozzle 5 upon receiving a pressure from the pressure generating source 14. Accordingly, portions where a solder bump is lacked (and/or portions with an insufficient amount of solder, see portions indicated by dotted lines in FIG. 3B) are filled with molten solder (see FIG. 3C), thus completing solder bumps (see FIG. 3D). According to this embodiment, even when the correction nozzle 5 comes into contact with a portion where a solder bump is already completed, the mask adjusts an amount of molten solder and hence, there is no possibility of molten solder adhering to a solder bump by an amount greater than an amount of contents of the mask. Therefore, the solder bump before the correction is performed is maintained as it is. Causing the correction head 1 to move on the workpiece one time allows the correction of solder bumps to be completed. After switching a pressure to be supplied into the tank 2 to a negative pressure generated by a reduced pressure generating device 16, the correction head 1 is elevated. After cooling is performed, the mask 8 is removed from the workpiece 7.

REFERENCE SIGNS LIST

1 head unit
2 tank
3 correction head
4 heater
5 correction nozzle
6 suction port
7 workpiece
8 mask
9 molten solder
10 extension pipeline
11 pressure supply means
12 suction pipe extension pipeline
13 reduced pressure supply means
14 pressure generating source
15 gate valve
16 reduced pressure generating device
17 extension pipeline
18 throttle valve
19 pressure generating source
20 pressure sensor
21 controller
22 fluid supply device

The invention claimed is:

1. A method for correcting a solder bump formed on a workpiece, the method comprising:
    placing a mask having a same pattern as the solder bump so as to cover the workpiece which has a defective portion having a defect of the solder bump and/or an insufficient amount of solder;
    heating a fluid for forming the solder bump by a first heater; and
    discharging the fluid for forming the solder bump from a correction head configured to discharge the fluid, which has been heated by the first heater, while the correction head is caused to scan on the mask so as to discharge the fluid into a portion of the mask which corresponds to the defective portion, and
    heating the fluid discharged into the mask by a second heater installed at a lower portion of the correction head.

2. The method according to claim 1, further comprising, sucking the fluid, which has been discharged into the mask and heated by the second heater, from the mask.

3. The method according to claim 1, further comprising, reducing a pressure of air in an opening portion of the mask before discharging the fluid for forming the solder bump.

4. A method for correcting a solder bump formed on a workpiece, the method comprising:

placing a mask having a same pattern as the solder bump so as to cover the workpiece which has a defective portion having a defect of the solder bump and/or an insufficient amount of solder;

heating a fluid for forming the solder bump by a first heater;

discharging the fluid for forming the solder bump from a correction head configured to discharge the fluid, which has been heated by the first heater, while the correction head is caused to scan on the mask so as to discharge the fluid into a portion of the mask which corresponds to the defective portion; and reducing a pressure of air in an opening portion of the mask before discharging the fluid for forming the solder bump.

\* \* \* \* \*